(12) United States Patent
Wang et al.

(10) Patent No.: US 10,354,920 B2
(45) Date of Patent: Jul. 16, 2019

(54) METHODS AND APPARATUS FOR MOS CAPACITORS IN REPLACEMENT GATE PROCESS

(71) Applicant: Taiwan Semiconductor Manufacturing Company, Ltd., Hsin-Chu (TW)

(72) Inventors: Pai-Chieh Wang, Zhubei (TW); Tung-Heng Hsieh, Zhudong Town (TW); Yimin Huang, Hsin-Chu (TW); Chung-Hui Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 185 days.

(21) Appl. No.: 15/231,215

(22) Filed: Aug. 8, 2016

(65) Prior Publication Data

US 2016/0351451 A1 Dec. 1, 2016

Related U.S. Application Data

(62) Division of application No. 13/303,083, filed on Nov. 22, 2011, now Pat. No. 9,412,883.

(51) Int. Cl.
*H01L 27/07* (2006.01)
*H01L 21/822* (2006.01)
(Continued)

(52) U.S. Cl.
CPC .... *H01L 21/822* (2013.01); *H01L 21/823437* (2013.01); *H01L 27/0629* (2013.01);
(Continued)

(58) Field of Classification Search
CPC ... H01L 29/66545; H01L 29/94; H01L 21/64; H01L 21/8232; H01L 27/07; H01L 27/0711
See application file for complete search history.

(56) References Cited

U.S. PATENT DOCUMENTS 4,131,524 A 12/1978 Gieles
4,478,655 A 10/1984 Nagakubo et al.
(Continued)

FOREIGN PATENT DOCUMENTS

EP 0238749 10/1986
EP 0354449 2/1990
(Continued)

OTHER PUBLICATIONS

Nakamura et al., "Effects of Selecting Channel Direction in Improving Performance of Sub-100nm MOSFETs Fabricated on (110) Surface Si Substrate," Japanese Journal of Applied Physics, vol. 43, No. 4B, Apr. 2004, pp. 1723-1728.
(Continued)

*Primary Examiner* — Cheung Lee
(74) *Attorney, Agent, or Firm* — Slater Matsuk, LLP (57) ABSTRACT

Methods and apparatus for polysilicon MOS capacitors in a replacement gate process. A method includes disposing a gate dielectric layer over a semiconductor substrate; disposing a polysilicon gate layer over the dielectric layer; patterning the gate dielectric layer and the polysilicon gate layer to form a plurality of polysilicon gates spaced by at least a minimum polysilicon to polysilicon pitch; defining a polysilicon resistor region containing at least one of the polysilicon gates and not containing at least one other of the polysilicon gates, which form dummy gates; depositing a mask layer over an inter-level dielectric layer; patterning the mask layer to expose the dummy gates; removing the dummy gates and the gate dielectric layer underneath the dummy gates to leave trenches in the inter-level dielectric layer; and forming high-k metal gate devices in the trenches in the inter-level dielectric layer. An apparatus produced by the method is disclosed.

20 Claims, 7 Drawing Sheets

(51) Int. Cl.
  *H01L 21/8234* (2006.01)
  *H01L 29/94* (2006.01)
  *H01L 27/06* (2006.01)
  *H01L 27/08* (2006.01)
  *H01L 49/02* (2006.01)
  *H01L 29/40* (2006.01)

(52) U.S. Cl.
  CPC ...... *H01L 27/0727* (2013.01); *H01L 27/0811* (2013.01); *H01L 28/20* (2013.01); *H01L 29/401* (2013.01); *H01L 29/94* (2013.01)

(56) References Cited

U.S. PATENT DOCUMENTS

| | | | |
|---|---|---|---|
| 4,605,919 | A | 8/1986 | Wilner |
| 4,660,068 | A | 4/1987 | Sakuma et al. |
| 4,799,990 | A | 1/1989 | Kerbaugh et al. |
| 4,835,585 | A | 5/1989 | Panousis |
| 4,843,025 | A | 6/1989 | Morita |
| 4,857,986 | A | 8/1989 | Kinugawa |
| 4,939,557 | A | 7/1990 | Pao et al. |
| 5,087,586 | A | 2/1992 | Chan et al. |
| 5,182,233 | A | 1/1993 | Inoue |
| 5,366,914 | A | 11/1994 | Takahashi et al. |
| 5,602,424 | A | 2/1997 | Tsubouchi et al. |
| 5,814,858 | A | 9/1998 | Williams |
| 5,963,822 | A | 10/1999 | Saihara et al. |
| 5,965,904 | A | 10/1999 | Ohtani et al. |
| 6,059,981 | A | 5/2000 | Nakasuji |
| 6,153,896 | A | 11/2000 | Omura et al. |
| 6,180,966 | B1 | 1/2001 | Kohno et al. |
| 6,225,669 | B1 | 5/2001 | Long et al. |
| 6,245,615 | B1 | 6/2001 | Noble et al. |
| 6,359,308 | B1 | 3/2002 | Hijzen et al. |
| 6,373,100 | B1 | 4/2002 | Pages et al. |
| 6,436,791 | B1 | 8/2002 | Lin et al. |
| 6,483,171 | B1 | 11/2002 | Forbes et al. |
| 6,495,883 | B2 | 12/2002 | Shibata et al. |
| 6,580,154 | B2 | 6/2003 | Noble et al. |
| 6,605,843 | B1 | 8/2003 | Krivokapic et al. |
| 6,621,132 | B2 | 9/2003 | Onishi et al. |
| 6,630,389 | B2 | 10/2003 | Shibata et al. |
| 6,710,403 | B2 | 3/2004 | Sapp |
| 6,903,393 | B2 | 6/2005 | Ohmi et al. |
| 6,919,610 | B2 | 7/2005 | Saitoh et al. |
| 6,924,198 | B2 | 8/2005 | Williams et al. |
| 6,960,821 | B2 | 11/2005 | Noble et al. |
| 6,967,112 | B2 | 11/2005 | Maa et al. |
| 6,995,439 | B1 | 2/2006 | Hill et al. |
| 7,217,606 | B2 | 5/2007 | Forbes et al. |
| 7,348,244 | B2 | 3/2008 | Aoki et al. |
| 7,361,952 | B2 | 4/2008 | Miura et al. |
| 7,663,195 | B2 | 2/2010 | Ohmi et al. |
| 7,928,518 | B2 | 4/2011 | Ohmi et al. |
| 8,242,581 | B1 | 8/2012 | Ratnakumar et al. |
| 8,409,954 | B2 | 4/2013 | Chau et al. |
| 8,878,337 | B1 * | 11/2014 | Pan .................. H01L 29/66545 257/532 |
| 2002/0104988 | A1 | 8/2002 | Shibata et al. |
| 2002/0155685 | A1 | 10/2002 | Sakakibara |
| 2003/0008483 | A1 | 1/2003 | Sato et al. |
| 2003/0073271 | A1 | 4/2003 | Bimer et al. |
| 2003/0082873 | A1 | 5/2003 | Zambrano |
| 2003/0102564 | A1 | 6/2003 | Darwish |
| 2003/0216038 | A1 * | 11/2003 | Madhukar ....... H01L 21/823842 438/648 |
| 2004/0043558 | A1 | 3/2004 | Wieczorek et al. |
| 2004/0155287 | A1 | 8/2004 | Omura et al. |
| 2004/0161886 | A1 | 8/2004 | Forbes et al. |
| 2004/0185665 | A1 | 9/2004 | Kishimoto et al. |
| 2004/0198003 | A1 | 10/2004 | Yee-Chia et al. |
| 2005/0026369 | A1 | 2/2005 | Noble et al. |
| 2005/0029585 | A1 | 2/2005 | He et al. |
| 2005/0079678 | A1 | 4/2005 | Verma et al. |
| 2005/0224890 | A1 | 10/2005 | Bernstein et al. |
| 2005/0253193 | A1 | 11/2005 | Chen et al. |
| 2005/0277278 | A1 | 12/2005 | Maleville et al. |
| 2006/0033139 | A1 | 2/2006 | Masuoka et al. |
| 2006/0046419 | A1 | 3/2006 | Sandhu et al. |
| 2006/0081919 | A1 | 4/2006 | Inoue et al. |
| 2006/0091456 | A1 | 5/2006 | Montgomery |
| 2006/0108635 | A1 | 5/2006 | Bhalla et al. |
| 2006/0128100 | A1 | 6/2006 | Aoki et al. |
| 2006/0138538 | A1 | 6/2006 | Ohmi et al. |
| 2006/0244061 | A1 | 11/2006 | Nowak et al. |
| 2006/0292825 | A1 | 12/2006 | Lerner |
| 2007/0001203 | A1 | 1/2007 | Lehr et al. |
| 2007/0034911 | A1 | 2/2007 | Kao |
| 2007/0048966 | A1 | 3/2007 | Chau et al. |
| 2008/0099344 | A9 | 5/2008 | Basol et al. |
| 2008/0157281 | A1 | 7/2008 | Chau et al. |
| 2008/0179648 | A1 | 7/2008 | Ha et al. |
| 2008/0191258 | A1 * | 8/2008 | Jia .......................... H01L 29/94 257/306 |
| 2008/0308870 | A1 | 12/2008 | Faul et al. |
| 2009/0004809 | A1 | 1/2009 | Chinthakindi et al. |
| 2009/0032889 | A1 | 2/2009 | Zhu et al. |
| 2009/0101956 | A1 | 4/2009 | Booth, Jr. et al. |
| 2009/0101989 | A1 | 4/2009 | Chen et al. |
| 2009/0104751 | A1 | 4/2009 | Chau et al. |
| 2009/0236669 | A1 * | 9/2009 | Chen ................ H01L 21/28079 257/380 |
| 2009/0242953 | A1 | 10/2009 | Booth, Jr. et al. |
| 2010/0019328 | A1 * | 1/2010 | Zhang ................ H01L 27/0629 257/380 |
| 2010/0032857 | A1 | 2/2010 | Izadnegahdar et al. |
| 2010/0038692 | A1 * | 2/2010 | Chuang ............... H01L 27/0629 257/298 |
| 2010/0072519 | A1 | 3/2010 | Ohmi et al. |
| 2010/0112808 | A1 | 5/2010 | Gurtej et al. |
| 2011/0215390 | A1 * | 9/2011 | Kim ..................... H01L 29/861 257/306 |
| 2011/0291170 | A1 * | 12/2011 | Chumakov ......... H01L 23/5223 257/300 |
| 2012/0037971 | A1 | 2/2012 | Kwon et al. |
| 2012/0049291 | A1 | 3/2012 | Scheiper et al. |
| 2013/0126953 | A1 | 5/2013 | Wang et al. |
| 2013/0126955 | A1 | 5/2013 | Wang et al. |

FOREIGN PATENT DOCUMENTS

| | | |
|---|---|---|
| EP | 1628337 A1 | 2/2006 |
| JP | 58100441 | 6/1983 |
| JP | 58168258 A | 10/1983 |
| JP | 58197839 | 11/1983 |
| JP | 61022630 A | 1/1986 |
| JP | 61256739 | 11/1986 |
| JP | 62298130 | 12/1987 |
| JP | 63284832 A | 11/1988 |
| JP | S63291449 A | 11/1988 |
| JP | 401008672 | 1/1989 |
| JP | 02-035736 A | 2/1990 |
| JP | 02058248 A | 2/1990 |
| JP | 2002231945 A | 8/2002 |
| JP | 2004056003 A | 2/2004 |
| JP | 2004146626 A | 5/2004 |
| JP | 2004356114 A | 12/2004 |
| KR | 1020040036958 A | 5/2004 |
| WO | 2004105116 A1 | 12/2004 |
| WO | 2006058210 A1 | 6/2006 |

OTHER PUBLICATIONS

Vanzant, "Microchip Fabrication," 2000, McGraw-Hill Publication, Fourth Edition, p. 32.

* cited by examiner

METHODS AND APPARATUS FOR MOS CAPACITORS IN REPLACEMENT GATE PROCESS

This application is a divisional of U.S. patent application Ser. No. 13/303,083, entitled "Method and Apparatus for MOS Capacitors in Replacement Gate Process," filed on Nov. 22, 2011 (now U.S. Pat. No. 9,412,833 Issues on Aug. 9, 2016), which application is hereby incorporated herein by reference.

RELATED APPLICATIONS

This application relates to the following co-pending and commonly assigned patent application Ser. No. 13/303,096, filed on Nov. 22, 2011, entitled, "Methods and Apparatus for Hybrid MOS Capacitors in Replacement Gate Process," which application is hereby incorporated herein by reference.

BACKGROUND

A common requirement for semiconductor processing of integrated circuits is formation of capacitors. Because the gates for MOS transistors lie over a dielectric material, these structures are also used as capacitors. The gate material can form one plate of capacitor, the dielectric material can form the capacitor dielectric, and the second plate of the capacitor may be formed by a doped conductive region in the substrate beneath the dielectric. MOS capacitors are particularly useful as capacitors that may be implemented on integrated circuits that also feature, for example, MOS transistors, resistors, memory cells, and other logic and circuit devices.

Recently the use of metal material as the gate conductors with high-k gate dielectrics has become more prevalent in "high-k metal gate" or "HKMG" semiconductor processes. As the metal gate conductors lie over a dielectric layer, MOS capacitors may be formed by using the metal gate conductor of the HKMG device as a first plate, the high-k dielectric material as the capacitor dielectric, and the second plate may be formed beneath the dielectric, for example by doping the substrate to form a conductive region. In this manner metal gate MOS capacitors may be formed in a HKMG replacement gate process. The metal gate material may be formed in a replacement gate process by replacing a previously formed dummy gate. The dummy gates are formed earlier in the process and may be used for certain process steps. Then, using photolithography pattern and etch steps to remove the dummy gates and the original gate dielectric, the replacement gate process exposes a gate trench area in an interlevel dielectric layer. High-k dielectrics may be used to form the dielectric in the replacement gate region. The metal replacement gate can be formed in a variety of ways, for example by deposition or plating, and then removing excess metal in a chemical mechanical polishing (CMP) process.

However, in order to obtain a capacitance of a useful value, a large area metal gate device, or many metal gate devices in a small area would be required. In the metal gate replacement processes, CMP loading effects can occur when the metal pattern exceeds a certain pattern density in a given area being processed. In CMP loading, dishing of the top portion of gate metal material has been observed during the CMP processing. The dishing is a defect and causes reduced device yields and increasing costs. This makes the use of MOS capacitors formed using metal replacement gate HKMG devices more costly, or even impractical.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of example and illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed inventive concepts, and do not limit the scope of the disclosure and do not limit the scope of the appended claims.

Embodiments of the present application, examples of which are now described in detail, provide novel methods and apparatus for manufacturing semiconductor devices; including providing a method for forming polysilicon MOS capacitors in a HKMG replacement gate process. The polysilicon capacitors may be formed using the process steps similar to those used for polysilicon resistors in the HKMG process, for example, and few if any new process steps are needed. By masking the polysilicon gates for the polysilicon MOS capacitors during dummy gate and oxide dielectric etch removal steps, the polysilicon MOS capacitors may be formed alongside HKMG replacement devices. Polysilicon MOS capacitors of the embodiments may be combined as a plurality of MOS capacitors coupled in parallel to obtain desired capacitance values. For example a plurality of MOS gate capacitors may be arranged as parallel strips over a common bottom plate diffusion. These polysilicon MOS capacitors may be combined with HKMG MOS capacitors so that both may be used in the same device. Alternatively a HKMG MOS device may be a transistor formed adjacent the polysilicon capacitors. The devices may be further coupled, if desired, to form a circuit. The novel use of the polysilicon capacitors of the disclosure with the HKMG devices eliminates the CMP loading problems of prior known approaches by reducing the metal gate pattern density in the MOS capacitor area. Lowering the metal pattern density during CMP processes eliminates or greatly reduces the possibility of dishing that occurs due to CMP loading in known approaches. Further the use of the embodiments provides additional capacitance with higher values per unit area than the corresponding prior HKMG capacitors would, so that use of the methods and apparatus of the embodiments provide better device performance, better process performance, and higher yield without substantial added costs or any need for changes to existing process equipment or materials.

Figure 1:
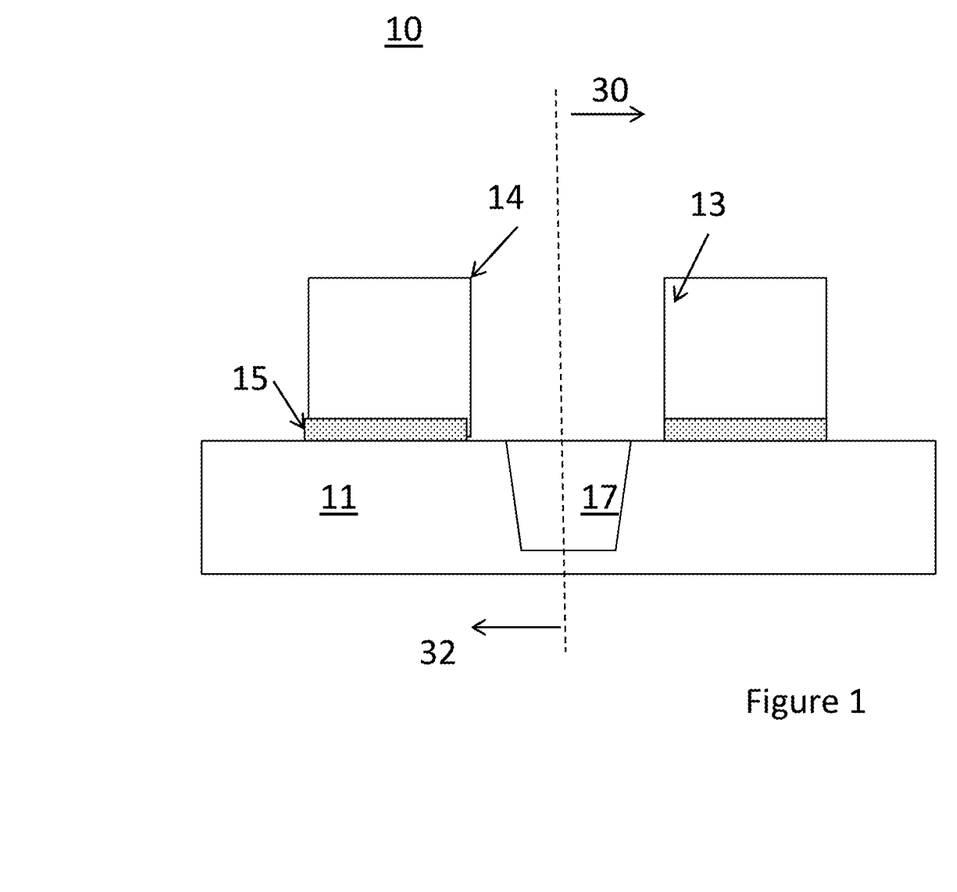
FIG. 1 depicts in a cross-sectional view an exemplary embodiment at an intermediate process step.

FIG. 1 depicts in a cross-sectional view an embodiment device 10 at an intermediate processing stage, including two polysilicon gate regions 13 and 14 formed in parallel over a substrate 11. Prior to the intermediate stage shown in FIG. 1, the substrate 11 received a shallow trench isolation (STI) region 17 defining active areas on either side of it. The STI 17 may be formed as a trench filled with various dielectrics including silicon oxide, silicon nitride, silicon oxynitride, other dielectric materials, and combinations of these. In an alternative embodiment, a local oxidation of silicon (LOCOS) isolation region may be formed as region 17. A dielectric 15, such as a gate oxide or gate nitride dielectric, is formed over the substrate 11 using, for example, thermal oxidation, PVD, CVD, PECVD, TEOS, spinning on or other methods for gate dielectric deposition. In an example embodiment, a silicon oxynitride (SiON) gate dielectric is deposited. A layer of polysilicon is deposited over the dielectric layer.

In FIG. 1, the region 30 shown extending on one side of the STI 17 is selected to be a polysilicon resistor processing region. The remaining region 32 is to be free of the resistor processing steps. Gate 14 of FIG. 1 is to be used as a dummy gate, which will be replaced in later processing with a metal gate; that is, it is a sacrificial element. The dielectric layer 15 that lies beneath gate 14 is also to be replaced later in the process.

A polysilicon resistor implant process may be performed only on the polysilicon material in region 30 and is not needed on the dummy gate polysilicon in region 32. To accomplish the resistor implant, a photolithographic patterning step is used to form and pattern a mask over the polysilicon gate 14, and an ion or other implant step is performed over region 30. The implant mask is then removed. The polysilicon is then patterned further to define the parallel gate strips 13 and 14 shown in FIG. 1 using a second photolithographic process by patterning a poly etch hardmask material over the polysilicon, using photoresist to pattern the etch mask, and then etching to remove the exposed polysilicon to define the parallel polysilicon gates 13 and 14 as shown in FIG. 1. Gate 13 is now a polysilicon resistor material, and gate 14 is a dummy polysilicon gate.

Figure 2:
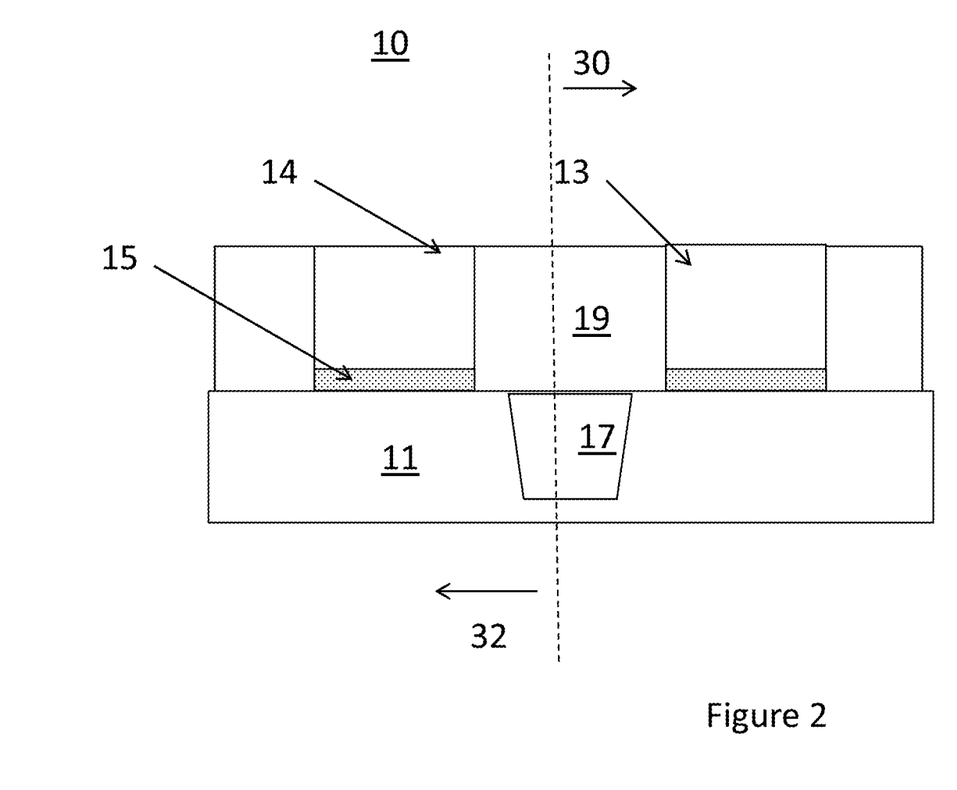
FIG. 2 depicts in a cross-sectional view the embodiment of FIG. 1 following further process steps.

FIG. 2 depicts the device 10 in a cross-section following additional processing. In FIG. 2, inter-level or interlayer dielectric layer (ILD) 19 is formed over the polysilicon gates 13 and 14, and filling the spaces between them extending to the surface of the substrate 11. Note that in the figures, no gate sidewalls or gate spacers are shown on the gates 13 and 14 for simplicity; however, in an actual process gate sidewalls formed of oxides, nitrides, oxynitrides or combinations, and having one or several layers, may be formed on the sidewalls of the polysilicon gate structures 13 and 14. Gate spacers may be formed to control spacing and provide self-alignment for source and drain diffusions, ion implants, tilt angle implants and the like. Sacrificial sidewall spacers may be used. To transition from the intermediate process stage of FIG. 1 to the cross-section of FIG. 2, several process steps are performed. The ILD layer 19 is deposited. This ILD dielectric 19 may be formed, as non-limiting examples, of silicon dioxide, silicon nitride, silicon oxynitride, carbon containing dielectrics, TEOS, and combinations of these, and may be low-k, high-k or oxide dielectrics, and may be formed of other known materials for ILD layers. Atomic level deposition (ALD), CVD, PECVD, PVD, thermal oxidation, or spin on steps may be used to form the ILD 19.

After ILD deposition, a chemical mechanical polishing (CMP) step "ILD CMP" may be performed to remove excess ILD material and planarize the top surface of the ILD with the top surfaces of the polysilicon gate strips 13 and 14, so the top surfaces of the polysilicon gates 13 and 14 are exposed at the surface of the ILD layer 19. If CMP is not used, then ILD chemical etching processes may be used instead.

Figure 3:
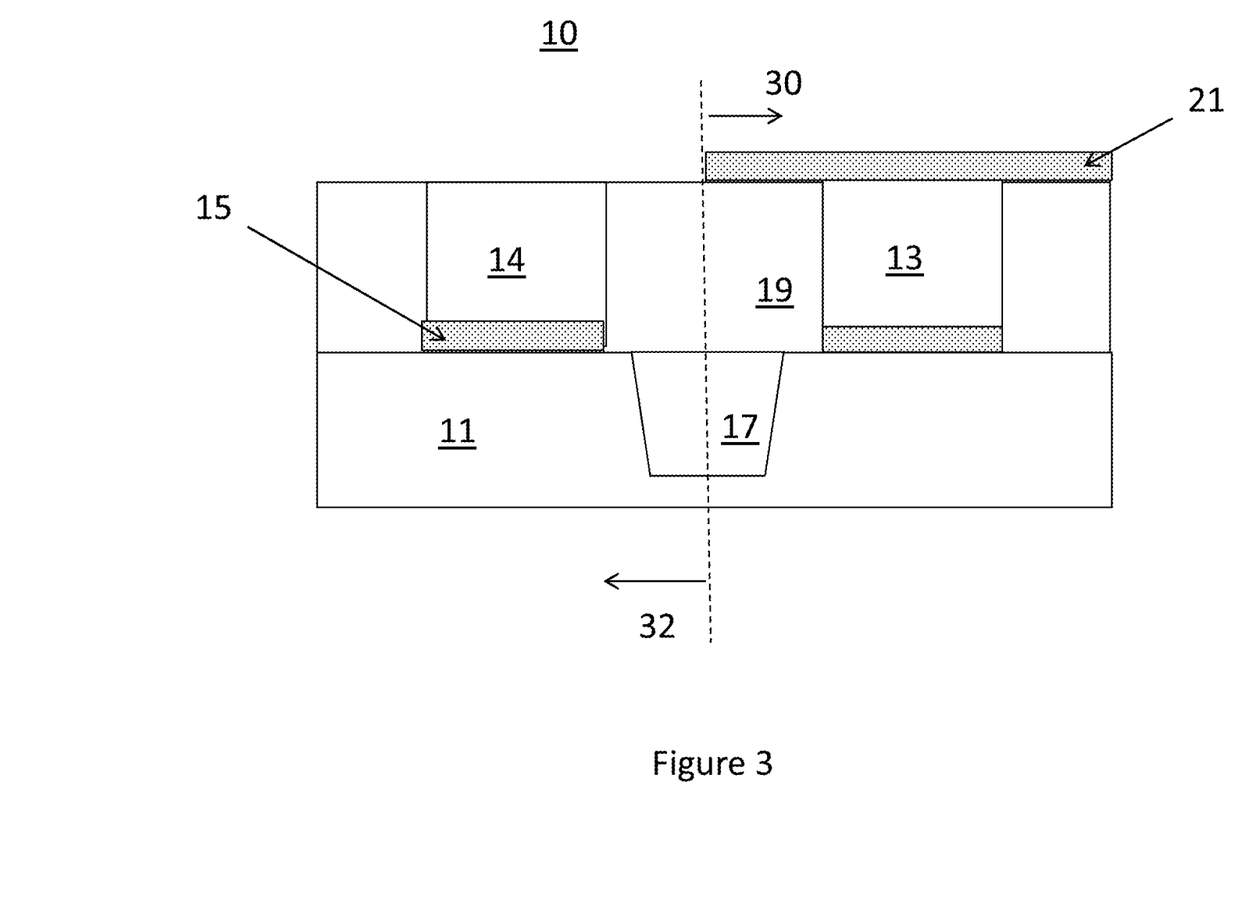
FIG. 3 depicts in a cross-sectional view the embodiment of FIG. 2 following further process steps.

FIG. 3 depicts device 10 of FIG. 2 in a cross-sectional view following additional process steps. In FIG. 3, a hardmask 21 is formed over the region 30 to protect the polysilicon 13, which will eventually form the top plate of a MOS capacitor. This mask may be of any material that is compatible with a selective etch process. Polysilicon gate 14 is a "dummy gate" and as shown in FIG. 3, is exposed and ready to be removed by subsequent process steps. To transition from the intermediate stage of the process shown in FIG. 2 to the stage illustrated in FIG. 3, several process steps were performed. A hardmask of an oxide or other etch mask was formed over the substrate 11. A photolithographic process was formed to deposit photoresist and pattern the photoresist, and an etch of the hardmask 21 was done to pattern the mask 21 as shown in FIG. 3. The remaining photoresist material was then removed by stripping. Alternatively, in some embodiments, the photoresist may remain over the hardmask 21.

Figure 4:
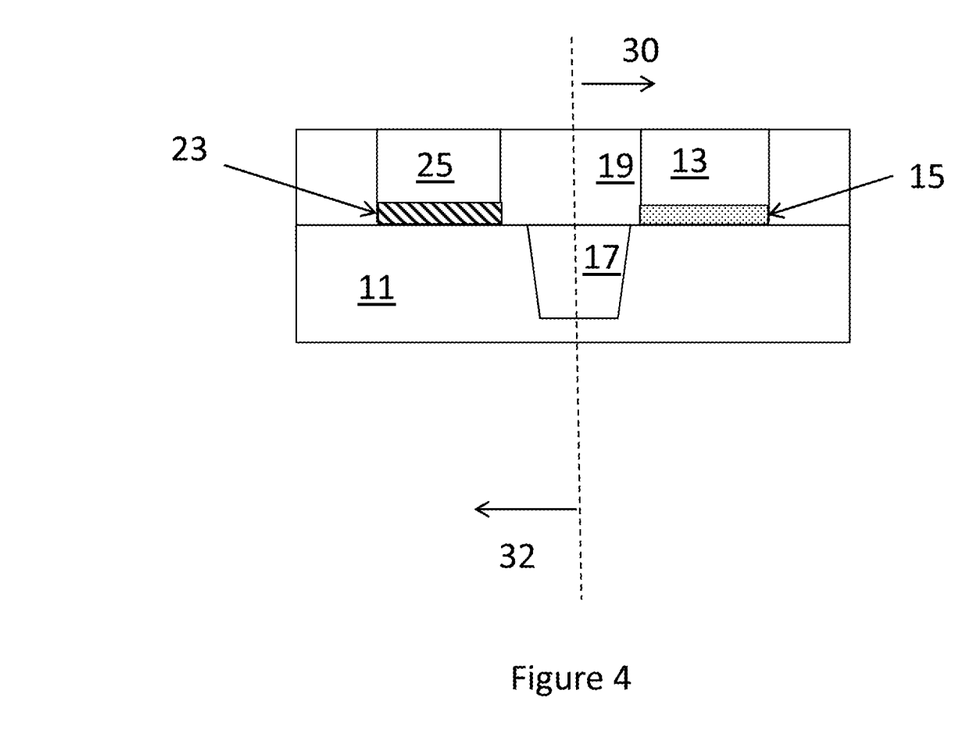
FIG. 4 depicts in a cross-sectional view the embodiment of FIG. 3 following additional process steps.

FIG. 4 depicts the device 10 in cross-section as shown in FIG. 3 following additional processing steps. In FIG. 4, the gate 14 and the gate dielectric underlying it have been removed, for example, by the above described etching processes. A high-k dielectric 23 has been deposited and a metal containing gate material 25 has been formed in the trench in ILD 19 that remained after the dummy gate removal. The high-k dielectric 23 and the metal gate 25 have replaced the dummy gate 14 shown in FIG. 3.

Several process steps were performed to transition from the intermediate stage shown in FIG. 3 to the cross-section of device 10 in FIG. 4. The dummy polysilicon gate 14 was removed by an etch process. The gate dielectric 15 beneath the dummy polysilicon gate 14 was also removed. High-k gate dielectric material was deposited to form high-k gate dielectric 25. A high-k dielectric has a dielectric constant, k, greater than that of silicon dioxide (oxide) dielectric, or greater than about 3.8. The material used can be any high-k gate dielectric; in one example, a hafnium based material is used, such as hafnium oxide. Other high-k gate dielectrics include, as non-limiting examples, hafnium silicate, zirconium silicate, hafnium dioxide and zirconium dioxide. The high-k dielectric may typically be deposited using atomic layer deposition (ALD) although alternate embodiments may use other processes for dielectric deposition.

A metal gate 25 is provided in the opening in ILD 19 as shown in FIG. 4. This metal gate may be formed by deposition such as ALD or other deposition processes. Alternatively, the metal gate may be formed by sputtering the metal seed layer, and depositing the metal gate material by electroplating. A CMP process is then performed to remove excess metal from the surface of ILD 19, and to planarize ILD 19 and the surface of the metal gate 25 with the surface of polysilicon gate 13. Refractory metals including tungsten (W), titanium (Ti), and W/TiN layers may be used. Other metals, including tantalum (Ta), molybdenum (Mo), and alloys of these, may be used. Aluminum (Al) may be used. Multiple layers for the metal gate may be used; for example, a TiN layer may be used as a first layer to adjust the work function of a high-k metal gate device, and partially fill the trench, and an aluminum conductor layer may then be deposited to complete the conductor layer. Barrier layers and diffusion layers may be used.

Thus, as shown in FIG. 4, device 10 contains both a high-k metal gate device 25 with high-k dielectric 23 and a polysilicon capacitor having a top plate of gate 13 that is a polysilicon doped for a resistor, for example, over a gate dielectric 15. The embodiments thus allow both HKMG devices and polysilicon MOS capacitors to exist in the same area or region of the substrate 11. Because the polysilicon resistor capacitors may be formed without increasing the metal pattern density for CMP and without the prior art detrimental effects including CMP loading, the problems associated with the prior art approaches are reduced or eliminated.

Figure 5:
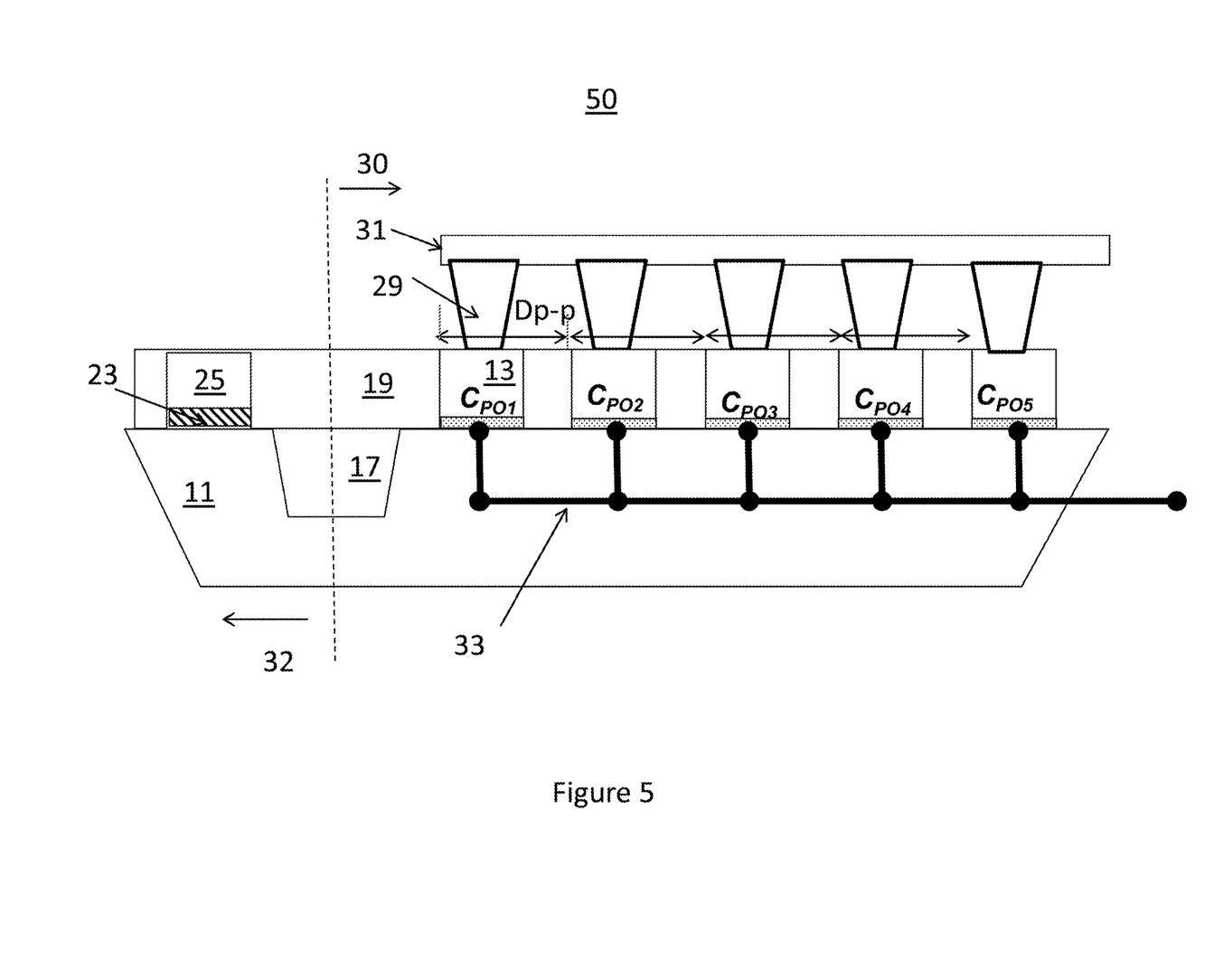
FIG. 5 depicts in a cross-sectional view another alternative embodiment.

FIG. 5 depicts in a cross-section a completed alternative embodiment structure 50. In FIG. 5, a semiconductor substrate 11 such as a wafer or an epitaxial layer such as a silicon on insulator (SOI) is shown. STI region 17 separates two regions, a region 30 which is a polysilicon resistor process region, and the remaining region 32, which is not. A HKMG device is formed of metal gate 25 and a high-k dielectric 23 in a replacement gate process as described above. A plurality of polysilicon gate strips 13 are doped as polysilicon resistors and form the top plates of capacitors $C_{PO1}$, $C_{PO2}$, $C_{PO3}$-$C_{PO5}$. More or less of these polysilicon capacitors may be provided in different applications and these form additional alternative embodiments. The distance 'Dp-p' illustrates the pitch between polysilicon regions (polysilicon-to-polysilicon minimum pitch). This pitch distance is determined by the process design rules, based on the photolithographic limitations of the process.

By spacing the polysilicon gates 13 by the minimum polysilicon-to-polysilicon pitch, the capacitance per area is optimized. In alternative embodiments, the spacing between the polysilicon gates 13 could be greater than the minimum pitch, and these form alternative embodiments. Vias 29 couple the polysilicon gates 13, which are the upper plates for the capacitors, to a common connector 31, which forms a top plate connection. This connector 31 may be, for example, a metal layer conductor such as a metal-1 layer conductor. This conductor may be formed of aluminum or more prevalently in recent processes, copper, and other conductors such as gold, other metals, conductive composites and alloys may be used. Barrier layers and diffusion barriers may be used to form the conductor layer 31. The vias 29 may be formed in a damascene CMP process for copper, for example, or by filling plugs with conductive via material; these form alternate embodiments, but are not limiting. ILD 19 thus provides the interlevel dielectric that contains the capacitors $C_{PO1}$-$C_{PO5}$ and the HKMG device. Many additional devices may be formed on substrate 11 and form an integrated circuit, including transistors, resistors, inductors, memory cells, analog circuits, varactors and the like. Circuits including processors, microprocessors, digital to analog converters, power circuits, radio transceivers and the like make be formed on the substrate 11, including the HKMG device and the polysilicon MOS capacitors.

The bottom plate of the parallel capacitor is indicated by connector 33, which connects the capacitors $C_{PO1}$-$C_{PO5}$ together. The connector 33 may be conveniently provided by forming a common diffusion region doped to be conductive and therefore electrically couple all of the polysilicon capacitors $C_{PO1}$-$C_{PO5}$. In this embodiment, the HKMG and the polysilicon MOS capacitors $C_{PO1}$-$C_{PO5}$ are electrically isolated by STI 17; however in other embodiments, the substrate could be arranged to electrically connect a source/drain region of an HKMG transistor formed using the gate 25 to the connector 33; for example, by doping a conductor in substrate 11 to connect to the bottom plate to form a portion of a desired circuit. In such an application, the STI region 17 might be omitted, this then forms yet another alternative embodiment.

The total capacitance obtained by the polysilicon capacitors in FIG. 5 is given by:

$$C_{TOTAL} = C_{PO1} + C_{PO2} + C_{PO3} + \quad \text{(Equation 1)}$$

The total capacitance can thus be increased by adding additional polysilicon gate strips 13, or decreasing the strips to obtain a desired value for $C_{TOTAL}$ in Equation 1. Using the standard pitch for the polysilicon strips 13 makes use of the embodiments straightforward from a processing standpoint. The use of the standard polysilicon does not increase CMP loading or create any difficulties in processing. The HKMG device formed by the gate 25 and the high-k dielectric may be arranged to form another capacitor, a transistor, a diode or other device. Thus, the capacitance $C_{TOTAL}$ could further be increased by coupling the HKMG device as another capacitor and coupling it in parallel using conductor 31 and additional connectors, for example. Although a single HKMG device is shown in FIG. 5, additional HKMG devices could also be provided.

Figure 6:
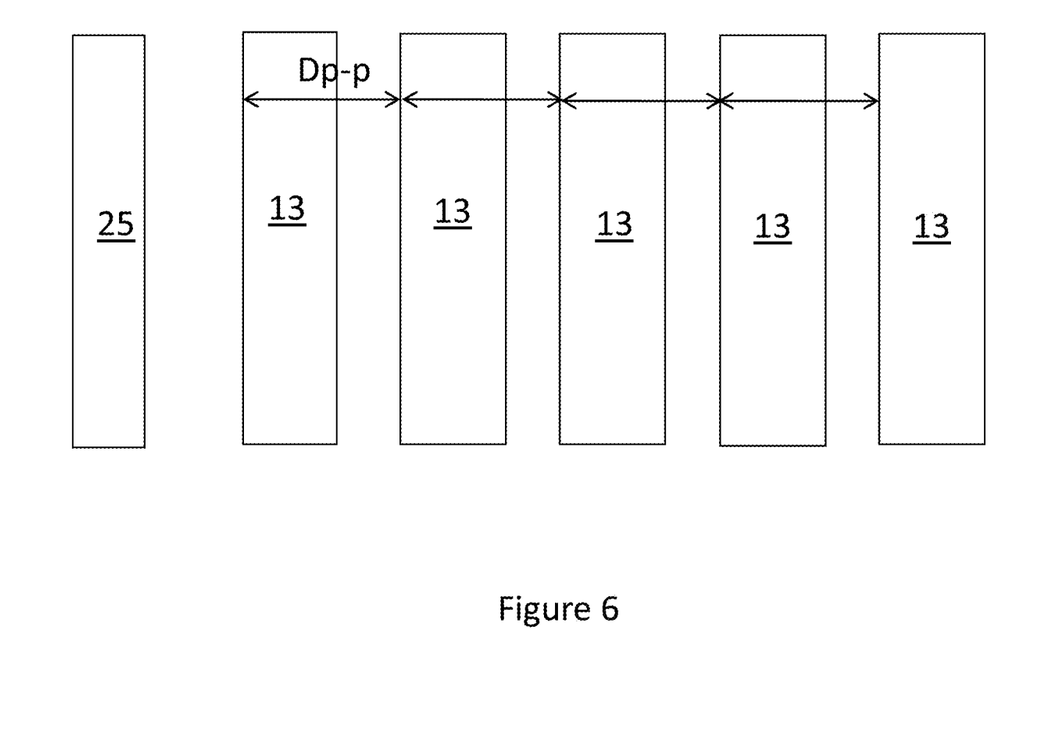
FIG. 6 depicts in a top view the embodiment of FIG. 5.

FIG. 6 depicts the gate regions in FIG. 5 from a top view, with metal gate 25 shown in parallel but spaced from the polysilicon gates 13, which are spaced from each other by at least the minimum poly-poly pitch Dp-p. This pitch is determined by the photolithography limits and design rules for a given metal gate semiconductor process used to fabricate the embodiments. Of course, this spacing may be increased but the polysilicon capacitor density is optimized if a minimum pitch is used.

Figure 7:
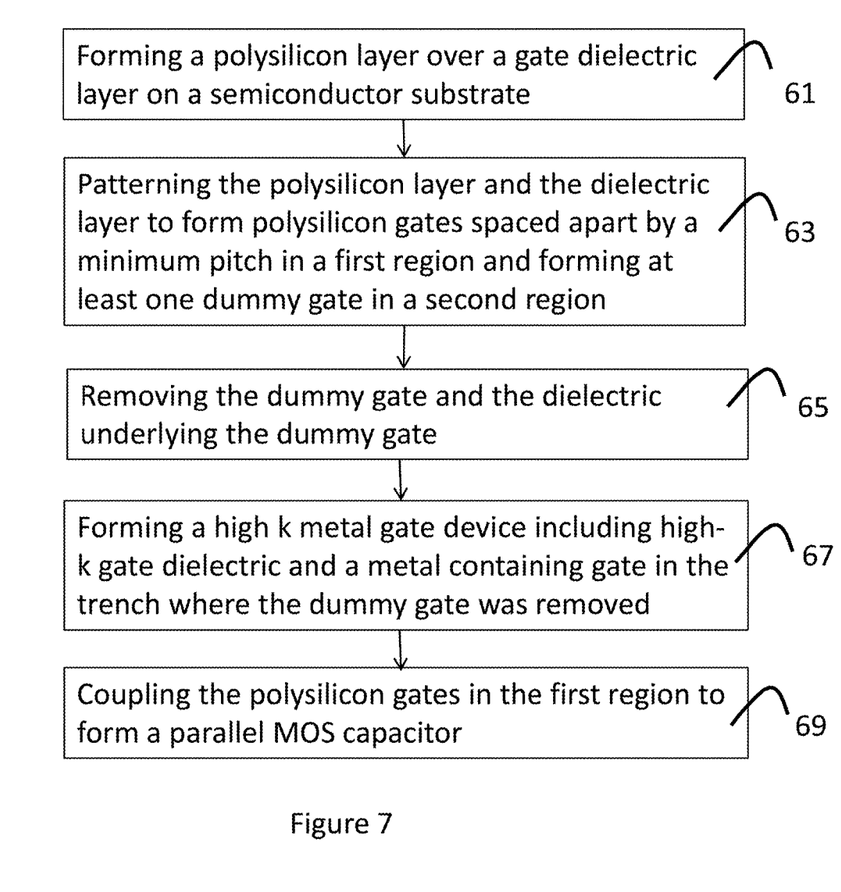
FIG. 7 depicts in a process flow diagram selected steps for an embodiment method.

FIG. 7 depicts in a process flow diagram selected steps of a method embodiment. A substrate is provided and a layer of polysilicon is deposited over a gate dielectric layer in step 61. In step 63, a plurality of polysilicon gates is formed by patterning the layers, the polysilicon gates are spaced apart by the polysilicon to polysilicon pitch in a first region. At least one dummy gate is formed in a second region. The first region may be processed in a polysilicon resistor process, and may receive an implant as part of that process, as described above.

In step 65, the dummy gate and the gate dielectric underlying the dummy gate are removed. In step 67, a high-k metal gate device is formed in the trench that remains in the interlevel dielectric layer where the at least one dummy gate was removed.

In step 69, the polysilicon gates in the first region are coupled together in parallel to form a parallel MOS polysilicon capacitor. In this manner, both the HKMG device and the polysilicon MOS capacitors may reside on the same substrate.

The method of FIG. 7 is but one illustrative embodiment, and the order of steps may be changed, and additional steps may be performed to form alternative embodiments that are envisioned as part of this disclosure and which are within the scope of the appended claims.

Using the embodiments, capacitors are obtained that perform as well as, and even better than, capacitors formed of only HKMG gate devices. In an example process comparing capacitors formed of Al metal gates with high-k dielectrics to the polysilicon/SiON MOS capacitors of the embodiments, the density obtained (femtoFarads/area) increased by 50% when the polysilicon MOS capacitors were used. Thus, the capacitance that can be formed in a given area is greatly increased by use of the embodiments, while at the same time the process yield is improved because the metal pattern density is reduced and the accompanying CMP loading problems of the prior HKMG capacitor approach can be reduced or entirely avoided.

In an embodiment, a method is provided including disposing a gate dielectric layer over a semiconductor substrate; disposing a polysilicon gate layer over the dielectric layer; patterning the gate dielectric layer and the polysilicon gate layer to form a plurality of polysilicon gates spaced by at least a minimum polysilicon to polysilicon pitch; forming an inter-level dielectric layer over the substrate and filling the spaces between the polysilicon gates and surrounding the polysilicon gates; defining a polysilicon resistor region containing at least one of the polysilicon gates and not containing at least one other of the polysilicon gates, which form dummy gates; depositing a mask layer over the inter-level dielectric layer; patterning the mask layer to expose the dummy gates; removing the dummy gates and the gate dielectric layer underneath the dummy gates to leave trenches in the inter-level dielectric layer; and forming high-k metal gate devices in the trenches in the inter-level dielectric layer. In another embodiment, the above method includes removing the remaining portions of the mask layer; and forming a connector electrically coupling the polysilicon gates in the polysilicon resistor region together, each of the polysilicon gates forming the top plate of a polysilicon MOS capacitor, the gate dielectric of each of the polysilicon gates forming the capacitor dielectric.

In another embodiment, the above described methods further include forming a conductive region in the substrate underlying the polysilicon gates in the polysilicon resistor region, the conductive region forming a bottom plate of the MOS capacitors. In yet another alternative embodiment, the above methods include total capacitance which is the sum of the capacitance provided by each of the polysilicon MOS capacitors, which are electrically coupled in parallel. In still another embodiment, the above methods include forming the high-k metal gate device which further comprises forming a high-k dielectric comprising hafnium. In still another alternative embodiment, the above methods include forming the high-k metal gate device which further includes forming a metal gate comprising titanium. In yet another method, the above methods include forming the high-k metal gate device which further includes forming a metal gate comprising aluminum. In a further embodiment, the above methods are performed including performing a chemical mechanical polishing on the metal gate.

In another alternative embodiment, an apparatus includes an isolation region in a semiconductor substrate defining a first region and a second region of the substrate; a high-k metal gate device formed in the first region proximal to the isolation region; and a polysilicon gate MOS capacitor formed in the second region proximal to the isolation region. In a further embodiment, the polysilicon gate MOS capacitor further includes a gate dielectric formed over the substrate and forming a capacitor dielectric; and a polysilicon gate formed over the gate dielectric and forming a top plate of the MOS capacitor. In still another embodiment, the gate dielectric includes silicon oxynitride. In a still further embodiment, the polysilicon gate is doped to form a polysilicon resistor. In yet another embodiment, the high-k metal gate device further includes a high-k gate dielectric disposed over the substrate; and a metal containing gate disposed over the high-k gate dielectric. In still a further embodiment, the high-k gate dielectric includes hafnium. In yet another embodiment, the metal containing gate includes titanium. In another embodiment, an apparatus includes a plurality of polysilicon gate strips disposed over a semiconductor substrate forming top plates of MOS capacitors, in parallel and spaced apart by at least a minimum pitch distance; gate dielectric material disposed under each of the polysilicon gate strips forming capacitor dielectric for the MOS capacitors; at least one high-k metal gate device disposed on the semiconductor substrate proximal to the plurality of polysilicon gate strips; and a portion of the semiconductor substrate underlying the polysilicon gate strips doped to form a bottom plate for the MOS capacitors.

In another embodiment, the gate dielectric material includes silicon oxynitride. In a further embodiment, the polysilicon gate strips are doped to form polysilicon resistor material. In still another embodiment, the top plates of the MOS capacitors are coupled together to form a parallel capacitor. In yet another embodiment, the high-k metal gate device further comprises a gate dielectric that includes hafnium.

The scope of the present application is not intended to be limited to the particular illustrative embodiments of the structures, methods and steps described in the specification. As one of ordinary skill in the art will readily appreciate from the disclosure herein, processes, or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. A method, comprising:
    disposing a gate dielectric layer over a semiconductor substrate;
    disposing a polysilicon gate layer over the gate dielectric layer;
    patterning the gate dielectric layer and the polysilicon gate layer to form a plurality of polysilicon gates spaced by at least a minimum polysilicon-to-polysilicon pitch;
    forming an inter-level dielectric layer over the semiconductor substrate and filling the spaces between the plurality of polysilicon gates and surrounding the plurality of polysilicon gates such that a top surface of the inter-level dielectric layer is level with top surfaces of polysilicon material of the plurality of polysilicon gates;
    defining a polysilicon resistor region containing a first set of polysilicon gates, the first set of polysilicon gates comprising at least one of the plurality of polysilicon gates and not containing at least one other of the plurality of polysilicon gates, which form dummy gates;
    depositing a mask layer over the inter-level dielectric layer;
    patterning the mask layer to expose the dummy gates;
    removing the dummy gates and the gate dielectric layer underneath the dummy gates to leave trenches in the inter-level dielectric layer; and
    forming metal gate devices in the trenches in the inter-level dielectric layer.

2. The method of claim 1, further comprising:
    forming a connector electrically coupling the first set of polysilicon gates in the polysilicon resistor region together, each of the polysilicon gates of the first set of polysilicon gates forming a top plate of a polysilicon MOS capacitor, the gate dielectric of each of the polysilicon gates of the first set of polysilicon gates forming a capacitor dielectric.

3. The method of claim 2, further comprising forming a conductive region in the semiconductor substrate underlying the first set of polysilicon gates in the polysilicon resistor region, the conductive region forming a bottom plate of the MOS capacitors.

4. The method of claim 3, wherein a total capacitance obtained is the sum of the capacitance provided by each of the polysilicon MOS capacitors.

5. The method of claim 1, wherein forming the metal gate device further comprises forming a high-k dielectric comprising hafnium.

6. The method of claim 1, wherein forming the metal gate device further comprises forming a metal gate comprising titanium or aluminum.

7. The method of claim 1 further comprising:
implanting the first set of polysilicon gates in the polysilicon resistor region with dopants to form polysilicon resistor material.

8. The method of claim 1, wherein forming the metal gate device further comprises forming a high-k dielectric comprising a material selected from the group consisting essentially of hafnium silicate, zirconium silicate, hafnium dioxide, and zirconium dioxide.

9. A method comprising:
forming a first gate stack in a first region of a substrate and a second gate stack in a second region of the substrate, the first gate stack comprising a first gate dielectric in contact with a first polysilicon gate, the second gate stack comprising a second gate dielectric in contact with a second polysilicon gate;
performing a polysilicon resistor implant process on the second polysilicon gate;
forming a dielectric layer over the substrate and between the first gate stack and the second gate stack, the dielectric layer contacting at least one sidewall of each of the first gate stack and the second gate stack;
planarizing the dielectric layer such that a top surface of the dielectric layer is level with a top surface of the first polysilicon gate of the first gate stack and a top surface of the second polysilicon gate of the second gate stack; and
replacing the first gate stack with a third gate stack, the third gate stack comprising a high-k gate dielectric and a metal gate.

10. The method of claim 9, wherein replacing the first gate stack with the third gate stack comprises;
forming a mask over the second gate stack;
removing the first polysilicon gate and the first gate dielectric to form a first trench in the dielectric layer;
forming the high-k gate dielectric in the first trench; and
forming the metal gate on the high-k gate dielectric.

11. The method of claim 9 further comprising a plurality of gate stacks in the second region, each of the gate stacks of the plurality of gate stacks comprising a gate dielectric layer and a polysilicon gate.

12. The method of claim 11 further comprising:
forming a connector electrically coupling the polysilicon gates of the second gate stack and the plurality of gate stacks together, each of the polysilicon gates forming a top plate of a polysilicon MOS capacitor, the gate dielectric of each of the polysilicon gates forming a capacitor dielectric.

13. The method of claim 12 further comprising:
doping the substrate underlying the polysilicon gates in the second region to form a doped region, the doped region forming a bottom plate of the polysilicon MOS capacitor.

14. The method of claim 11, wherein a first edge of one of the polysilicon gates in the second region is spaced apart from a corresponding second edge of another polysilicon gate by a minimum pitch, and wherein the minimum pitch is determined by processing limitations for forming metal gates.

15. The method of claim 9, wherein the second gate dielectric comprises silicon oxynitride.

16. The method of claim 9, wherein the metal gate comprises titanium or aluminum.

17. A method comprising:
forming a polysilicon layer over a gate dielectric layer over a substrate;
patterning the polysilicon layer and the gate dielectric layer to form a dummy gate and a dummy gate dielectric in a first region and a plurality of polysilicon gates and a plurality of gate dielectrics in a second region;
removing the dummy gate and the dummy gate dielectric;
forming a high-k gate dielectric where the dummy gate and the dummy gate dielectric were removed; and
forming a metal gate on the high-k gate dielectric;
planarizing the metal gate and the polysilicon layer of the plurality of polysilicon gates such that a top surface of the metal gate is coplanar with top surfaces of the polysilicon layer of the plurality of polysilicon gates; and
doping the substrate in the second region to form a doped region, the doped region being a bottom plate for MOS capacitors, a top surface of the doped region being planar, and the top surface of the doped region extending between adjacent gate dielectrics of the plurality of gate dielectrics.

18. The method of claim 17 further comprising:
forming a conductive connector over and electrically coupled to the polysilicon gates of the plurality of polysilicon gates in the second region of the substrate, the electrically coupled plurality of polysilicon gates forming top plates of MOS capacitors.

19. The method of claim 18, wherein the conductive connector comprises vias contacting the plurality of polysilicon gates and an overlying common conductive connector contacting the vias.

20. The method of claim 17, wherein the gate dielectrics have a different material composition than the high-k gate dielectric.

* * * * *